(12) United States Patent
Yeo et al.

(10) Patent No.: US 8,603,909 B2
(45) Date of Patent: Dec. 10, 2013

(54) INTEGRATED CIRCUIT PACKAGING SYSTEM WITH CORE REGION AND BOND PAD AND METHOD OF MANUFACTURE THEREOF

(75) Inventors: Alfred Yeo, Singapore (SG); Kai Chong Chan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1016 days.

(21) Appl. No.: 12/613,224

(22) Filed: Nov. 5, 2009

(65) Prior Publication Data

US 2011/0101545 A1    May 5, 2011

(51) Int. Cl.
*H01L 21/28* (2006.01)

(52) U.S. Cl.
USPC .......................................... 438/612; 257/786

(58) Field of Classification Search
USPC .................... 257/738, 786; 438/612, 666
See application file for complete search history.

(56) References Cited

U.S. PATENT DOCUMENTS

| | | | |
|---|---|---|---|
| 5,604,330 A | 2/1997 | Hasan et al. | |
| 5,818,114 A | 10/1998 | Pendse et al. | |
| 6,133,052 A * | 10/2000 | Ichihara | 438/7 |
| 6,933,607 B2 * | 8/2005 | Ono et al. | 257/737 |
| 7,777,223 B2 * | 8/2010 | Komatsu | 257/48 |
| 8,227,917 B2 * | 7/2012 | Hsu et al. | 257/738 |
| 2002/0125584 A1* | 9/2002 | Umehara et al. | 257/786 |
| 2007/0228555 A1 | 10/2007 | Huang et al. | |
| 2009/0091032 A1 | 4/2009 | Hsu et al. | |
| 2009/0108447 A1 | 4/2009 | Jo et al. | |
| 2010/0314620 A1* | 12/2010 | Furusawa et al. | 257/48 |

* cited by examiner

*Primary Examiner* — Nathan Ha
(74) *Attorney, Agent, or Firm* — Ishimaru & Associates LLP

(57) ABSTRACT

A method of manufacture of an integrated circuit packaging system includes: providing a semiconductor substrate; forming a core region on the semiconductor substrate with the core region having a core side; forming an inner bond pad on the semiconductor substrate with the inner bond pad having an inner core pad and an inner probe pad with the inner probe pad further from the core region than the inner core pad; and forming an outer bond pad on the semiconductor substrate and adjacent the inner bond pad with the outer bond pad having an outer core pad and an outer probe pad with the outer probe pad closer to the core region than the outer core pad, and the inner probe pad and the outer probe pad aligned parallel to the core side.

20 Claims, 5 Drawing Sheets

INTEGRATED CIRCUIT PACKAGING SYSTEM WITH CORE REGION AND BOND PAD AND METHOD OF MANUFACTURE THEREOF

TECHNICAL FIELD

The present invention relates generally to an integrated circuit packaging system, and more particularly to a system for an integrated circuit packaging system with bond pad.

BACKGROUND ART

Modern electronics, such as smart phones, cell phones, digital cameras, personal digital assistants, location based services devices, and enterprise class appliances, are packing more integrated circuits into an ever shrinking physical space with expectations for decreasing cost. As more functions are packed into the integrated circuits and more integrated circuits into the package, integrated circuit packages must continue to provide a mechanism for making electrical interconnection between the integrated circuit die and the leads that are utilized to make electrical interconnections to circuits, power, and ground external to the integrated circuit die. In the early stages of integrated circuit development, there were relatively few connections between the integrated circuit die and the external circuitry.

Wire bonding is a common and mature interconnection technology, which electrically connects a die to a substrate or an interposer. Connections between the die and the substrate or the interposer allow input/output (I/O) signals on the die to enter or leave by way of bond pads located on edges of the die.

The wire bonding process has become more challenging, especially in producing a smaller bond deformation on a limited pad area in a repeatable manner. The wire bonding process must fulfill a bond strength (i.e. a wire pull test or a ball shear test) criterion to meet reliability requirements.

Demands for high computing speed, memory space, and complex integrated circuit (IC) devices with increased functions per chip require a high input/output (I/O) density. However, the high I/O density continues to be limited by the space (or "real estate") available due to a tight geometry constraint.

Thus, a need still remains for an integrated circuit packaging system including the high I/O density and the reliability requirements. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a semiconductor substrate; forming a core region on the semiconductor substrate with the core region having a core side; forming an inner bond pad on the semiconductor substrate with the inner bond pad having an inner core pad and an inner probe pad with the inner probe pad further from the core region than the inner core pad; and forming an outer bond pad on the semiconductor substrate and adjacent the inner bond pad with the outer bond pad having an outer core pad and an outer probe pad with the outer probe pad closer to the core region than the outer core pad, and the inner probe pad and the outer probe pad aligned parallel to the core side.

The present invention provides an integrated circuit packaging system, including: a semiconductor substrate; a core region on the semiconductor substrate with the core region having a core side; an inner bond pad on the semiconductor substrate with the inner bond pad having an inner core pad and an inner probe pad with the inner probe pad further from the core region than the inner core pad; and an outer bond pad on the semiconductor substrate and adjacent the inner bond pad with the outer bond pad having an outer core pad and an outer probe pad with the outer probe pad closer to the core region than the outer core pad, and the inner probe pad and the outer probe pad aligned parallel to the core side.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
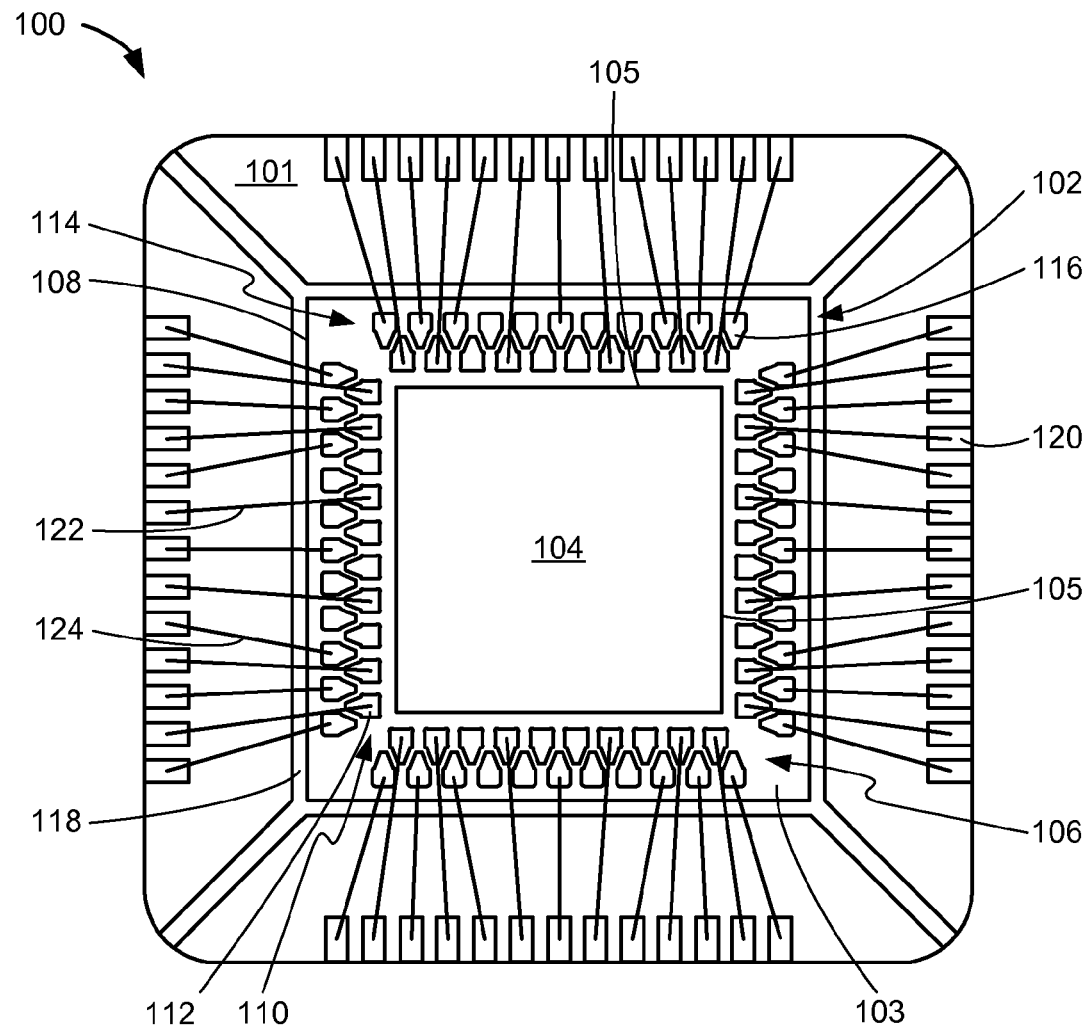
FIG. 1 is a top plan view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Referring now to FIG. 1, therein is shown a top plan view of an integrated circuit packaging system 100 in a first embodiment of the present invention. The top plan view is shown without a top portion of an encapsulation 101, such as a cover including an epoxy molding compound, an encapsulation material, or a molding material.

The integrated circuit packaging system 100 can include a semiconductor component 102, such as an integrated circuit, a die, a chip, a semiconductor device, or a semiconductor package. The semiconductor component 102 can include a semiconductor substrate 103, such as a silicon, a chip substrate, a die substrate, a metalized substrate, a glass substrate, or a semiconductor device mounting support.

The semiconductor component 102 can be formed to include a core region 104, which can include an interior portion of the semiconductor component 102 with digital or analog circuits. The core region 104 can include a core side 105, which can include one of the sides at the perimeter of the core region 104. The core region 104 can be formed over or on the semiconductor substrate 103. The semiconductor component 102 includes a pad region 106, which can include input/output (I/O) cells and I/O pads, formed surrounding the core region 104 and over or on the semiconductor substrate 103.

The I/O pads can surround the I/O cells at a component periphery 108, which can include a boundary or a perimeter of the semiconductor component 102. The pad region 106 can be provided between the core region 104 and the component periphery 108.

The pad region 106 can include an inner row 110 of I/O pads. The inner row 110 can be adjacent the core region 104. The inner row 110 can include an inner bond pad 112, such as an I/O pad, a contact pad, or a pad for attaching a wire or an interconnect thereto, formed over or on the semiconductor substrate 103. The inner bond pad 112 can be outside the core region 104.

The inner bond pad 112 can be electrically interconnected to an I/O cell, which in turn provides access to or from the core region 104. The inner bond pad 112 can be formed with Aluminum (Al) or any other conductive material.

The pad region 106 can include an outer row 114 of I/O pads. The outer row 114 can be adjacent the component periphery 108. The outer row 114 can include an outer bond pad 116, such as an I/O pad, a contact pad, or a pad for attaching a wire or an interconnect thereto, formed over or on the semiconductor substrate 103. The outer bond pad 116 can be outside the core region 104.

The outer bond pad 116 can be electrically interconnected to an I/O cell, which in turn provides access to or from the core region 104. The outer bond pad 116 can be formed with Aluminum (Al) or any other conductive material.

The integrated circuit packaging system 100 can include a package carrier 118, such as a leadframe, a substrate, a laminate substrate, a die-attach paddle, or a die-attach pad. The semiconductor component 102 can be attached over the package carrier 118 with an attach layer, such as a die attach adhesive, a chip attach adhesive, or an adhesive film.

The integrated circuit packaging system 100 can include a terminal 120, such as a lead or a lead finger, adjacent the package carrier 118. The terminal 120 can provide connectivity to external systems.

The integrated circuit packaging system 100 can include a first interconnect 122 and a second interconnect 124, such as a conductive wire or a bond wire. The first interconnect 122 and the second interconnect 124 can be attached or connected to the inner bond pad 112 and the outer bond pad 116, respectively, and the terminal 120.

The integrated circuit packaging system 100 can include the encapsulation 101, covering the semiconductor component 102, the package carrier 118, the terminal 120, the first interconnect 122, and the second interconnect 124. The encapsulation 101 can expose a portion of the terminal 120 for further connections to the next system level (not shown), such as a printed circuit board (PCB) or an integrated circuit package.

The integrated circuit packaging system 100 is not limited to a leadframe packaging configuration but can also have a laminate packaging configuration. For example, in a leadframe packaging configuration, the semiconductor component 102 can be attached over a leadframe chip carrier, and the terminal 120 is connected to the next system level at the package periphery. Also for example, in a laminate packaging configuration, the semiconductor component 102 can be attached over a laminate chip carrier, and the terminal 120 is re-distributed within the laminate package area and connected to the next system level by the bottom package ball grid array (BGA) solder bumps.

Figure 2:
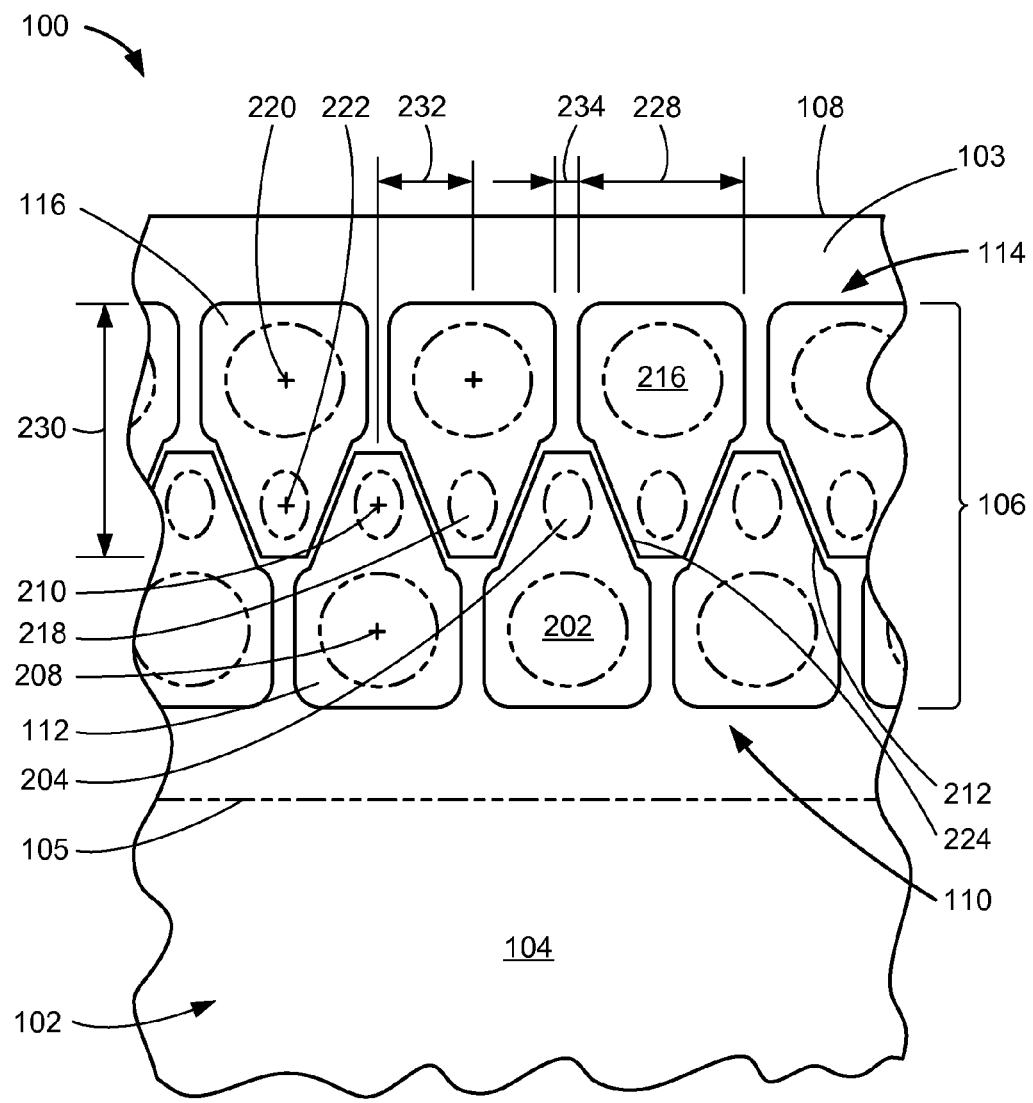
FIG. 2 is a more detailed view of a portion of the integrated circuit packaging system.

Referring now to FIG. 2, therein is shown a more detailed view of a portion of the integrated circuit packaging system 100. The more detailed view is depicted with a portion of the pad region 106 without passivation. The integrated circuit packaging system 100 can include the semiconductor component 102 having the semiconductor substrate 103. The semiconductor substrate 103 can include the core region 104 and the pad region 106 between the core region 104 and the component periphery 108.

The more detailed view depicts the inner row 110 having the inner bond pad 112. The inner bond pad 112 can include an inner core pad 202, which can include a wire ball bond area. The inner core pad 202 provides a permanent connection to the core region 104 in the final product of the integrated circuit packaging system 100.

The inner bond pad 112 can also include an inner probe pad 204, which can include a probe mark area, a probe point, or a portion of a pad where a lead or a probe of a probe card contacts. The inner probe pad 204 is intended for probe test and not for providing permanent connection to the core region 104 in the final product of the integrated circuit packaging system 100. The inner probe pad 204 can be further from the core region 104 than the inner core pad 202.

The inner bond pad 112 can be formed having the inner core pad 202 and the inner probe pad 204 substantially aligned perpendicular to the core side 105. Here, the term "aligned perpendicular" means a geometric line through the centers of the inner core pad 202 and the inner probe pad 204 would intersect the core side 105 in a substantially perpendicular angle.

The inner core pad 202 can include an inner core pad center 208. The inner probe pad 204 can include an inner probe pad center 210. The inner core pad center 208 and the inner probe pad center 210 are substantially aligned perpendicularly to the core side 105. The inner core pad center 208 or the inner probe pad center 210 can include a point that is substantially equidistant from points on an edge of the inner core pad 202 or the inner probe pad 204, respectively.

For illustrative purposes, the inner core pad 202 and the inner probe pad 204 are shown substantially circular having the inner core pad center 208 and the inner probe pad center 210, respectively, although it is understood that the inner core pad 202 and the inner probe pad 204 can be formed in different geometric configurations. For example, the inner core pad 202 and the inner probe pad 204 can be formed in a non-standard geometric shape where a center is not known by a standard geometric definition. In this situation, a center can be defined, for example by the intersection of two diagonal line segment joining the four corners with two at the most distance ends of the other. Another example, the center can be defined by a center of the area distribution of the inner core pad 202 or the inner probe pad 204.

The inner bond pad 112 can include an inner abutment portion 212 facing the outer bond pad 116. As an example, the inner abutment portion 212 is shown as a triangular shape with the tip of the triangle in a straight and parallel to the core region 104. The inner probe pad 204 is within the inner abutment portion 212.

The more detailed view depicts the outer row 114 having the outer bond pad 116. The outer bond pad 116 can include an outer core pad 216, which can include a wire ball bond area. The outer core pad 216 provides a permanent connection to the core region 104 in the final product of the integrated circuit packaging system 100.

The outer bond pad 116 can also include an outer probe pad 218, which can include a probe mark area, a probe point, or a portion of a pad where a lead or a probe of a probe card contacts. The outer probe pad 218 is intended for probe test and not for providing permanent connection to the core region 104 in the final product of the integrated circuit packaging system 100. The outer probe pad 218 can be closer to the core region 104 than the outer core pad 216. The inner cord pad 202 is between the outer probe pad 218 and the core side 105.

The outer probe pad 218 and the inner probe pad 204 can be substantially aligned parallel to the core side 105. Here, the term "aligned parallel" means a geometric line through the centers of the outer probe pad 218 and the inner probe pad 204 would be substantially parallel to the core side 105.

The outer core pad 216 and the outer probe pad 218 are substantially aligned perpendicular to the core side 105. The outer core pad 216 can include an outer core pad center 220. The outer probe pad 218 can include an outer probe pad center 222. The outer core pad center 220 and the outer probe pad center 222 are substantially aligned perpendicular to the core side 105. The outer core pad center 220 or the outer probe pad center 222 can include a point that is substantially equidistant from points on an edge of the outer core pad 216 or the outer probe pad 218, respectively.

For illustrative purposes, the outer core pad 216 and the outer probe pad 218 are shown substantially circular having the outer core pad center 220 and the outer probe pad center 222, respectively, although it is understood that the outer core pad 216 and the outer probe pad 218 can be formed in different geometric configurations. For example, the outer core pad 216 and the outer probe pad 218 can be formed in a non-standard geometric shape where a center is not known by a standard geometric definition. In this situation, a center can be defined, for example by the intersection of two diagonal line segment joining the four corners with two at the most distance ends of the other. Another example, the center can be defined by a center of the area distribution of the outer core pad 216 or the outer probe pad 218.

The outer bond pad 116 can include an outer abutment portion 224 facing the inner bond pad 112. The outer abutment portion 224 is the substantially the same geometric shape as and symmetrical to the inner abutment portion 212. The inner row 110 of the inner bond pad 112 has the inner abutment portion 212 facing the outer abutment portion 224 in the outer row 114 of the outer bond pad 116. The outer probe pad 218 is within the outer abutment portion 224.

The inner bond pad 112 or the outer bond pad 116 can include a bond pad width 228, which can be at right angles to a bond pad length 230 of the inner bond pad 112 or the outer bond pad 116, respectively. The bond pad width 228 can vary depending on process technologies. For example, the bond pad width 228 can be greater than that of a conventional fine pitch wirebond pad structure.

For illustrative purposes, the inner bond pad 112 and the outer bond pad 116 are shown having the same dimension of the bond pad width 228, although it is understood that the inner bond pad 112 can have a pad width that is different than that of the outer bond pad 116. For example, the inner bond pad 112 can have a pad width that is smaller than that of the outer bond pad 116.

The bond pad length 230 of the inner bond pad 112 or the outer bond pad 116 can include a longest dimension of the inner bond pad 112 or the outer bond pad 116, respectively. The bond pad length 230 can vary depending on process technologies. For example, the bond pad length 230 can be substantially equal to that of a conventional fine pitch wirebond pad structure.

For illustrative purposes, the inner bond pad 112 and the outer bond pad 116 are shown having the same dimension of the bond pad length 230, although it is understood that the inner bond pad 112 can have a pad length that is different than that of the outer bond pad 116. For example, the inner bond pad 112 can have a pad length that is greater than that of the outer bond pad 116.

The integrated circuit packaging system 100 can include a pad pitch 232, which can include a measurement taken from a center of a pad to a center of another pad that is adjacent and closest to the pad. The pad pitch 232 can include a measurement taken between the inner core pad center 208 and the outer core pad center 220 that is adjacent and closest to the inner core pad center 208. The outer bond pad 116 can be formed with the pad pitch 232 that can be approximately half of the bond pad width 228 of the outer bond pad 116.

For illustrative purposes, the pad pitch 232 between the inner bond pad 112 and the outer bond pad 116 is the same, although it is understood that the pad pitch 232 can be different between the inner row 110 and the outer row 114. For example, the pad pitch 232 from the inner bond pad 112 to the outer bond pad 116 adjacent the inner bond pad 112 is different than that from the outer bond pad 116 to another of the inner bond pad 112 adjacent the outer bond pad 116.

The inner bond pad 112 can be substantially the same as the outer bond pad 116. The outer bond pad 116 can be placed or formed adjacent the inner bond pad 112. The outer bond pad 116 can be placed between the inner bond pad 112 and another of the inner bond pad 112.

The outer bond pad 116 and the inner bond pad 112 can be formed in a staggered configuration. The outer bond pad 116 and the inner bond pad 112 can be placed at alternating positions and offset relative to each other.

The outer bond pad 116 and the inner bond pad 112 can be formed with the inner probe pad 204 and the outer probe pad 218 therebetween. The inner bond pad 112 and the outer bond pad 116 can be isolated or separated by probe areas, which can include the inner probe pad 204 and the outer probe pad 218.

A portion of the outer bond pad 116 can be adjacent with a portion of the inner bond pad 112. The outer abutment portion 224 of the outer bond pad 116 can be adjacent with the inner abutment portion 212 of the inner bond pad 112.

The integrated circuit packaging system 100 can provide a probing area, which can include the inner probe pad 204 and the outer probe pad 218, positioned in between alternate staggered bond pads, which can include the inner bond pad 112 and the outer bond pad 116, with an in-line probing orientation. The in-line probing orientation can include the inner probe pad center 210 substantially in-line or collinear with the outer probe pad center 222.

The integrated circuit packaging system 100 can include a bond pad spacing 234, which can represent a gap or a measurement taken in an area that is between the inner bond pad 112 and another of the inner bond pad 112 or the outer bond pad 116 and another of the outer bond pad 116. The another of the inner bond pad 112 and the another of the outer bond pad 116 can be formed adjacent the inner bond pad 112 and the outer bond pad 116, respectively. The bond pad spacing 234 can vary depending on process technologies and design rules. For example, the bond pad spacing 234 can be greater than 2 microns (um) in order to prevent any ball bonding induced passivation sidewall damages or deformation.

The inner bond pad 112 or the outer bond pad 116 can be attached or connected to the terminal 120 of FIG. 1 by the first interconnect 122 of FIG. 1 or the second interconnect 124 of FIG. 1, respectively. The terminal 120 can be provided for further connections to the next system level.

It has been discovered that the present invention provides the outer bond pad 116 and the inner bond pad 112 formed in a staggered configuration resulting in improved reliability. The outer bond pad 116 can be formed at an offset from the inner bond pad 112. The offset can be provided by the pad pitch 232 that can be approximately half of a ball bond diameter or the bond pad width 228. Pairs of staggered bond pads, which can include the inner bond pad 112 and the outer bond pad 116, can be placed apart at a distance based on the bond pad spacing 234. There is no close proximity of wire ball bonds, thereby eliminating damages that can occur to a passivation sidewall.

It has also been discovered that the present invention provides the integrated circuit packaging system 100 with a finer pitch compared to conventional fine pitch pad designs. The inner bond pad 112 and the outer bond pad 116 are placed in the staggered configuration, providing a separation between the inner core pad 202 and the outer core pad 216. The separation allows the pad pitch 232 to be approximately half of the bond pad width 228 or smaller than that of an existing bond pad design. The present invention can reduce the pad pitch 232 by more than 50% as compared to the conventional wire bond pad design, resulting in the finer pitch.

It has further been discovered that the present invention provides the integrated circuit packaging system 100 with a further increase in reliability. With the inner probe pad 204 and the outer probe pad 218, the present invention provides dedicated, separate test areas. This eliminates potential damages that affect wirebond connections at the inner core pad 202 and the outer core pad 216, resulting in the further increase in reliability. The further increase in reliability further increases yield and improves cost.

It has yet further been discovered that the present invention provides the integrated circuit packaging system 100 with an improvement in making wirebonding connections. The integrated circuit packaging system 100 provides the separation between the inner core pad 202 and the outer core pad 216. The separation allows more room for the first interconnect 122 or the second interconnect 124 to be attached to the terminal 120 and the inner core pad 202 or the outer core pad 216, respectively. As such, the present invention provides the improvement in making the wirebonding connections, making it possible to overcome constraints (e.g. tight geometry constraints) imposed by wirebonding typically with conventional fine pitch pad designs.

Figure 3:
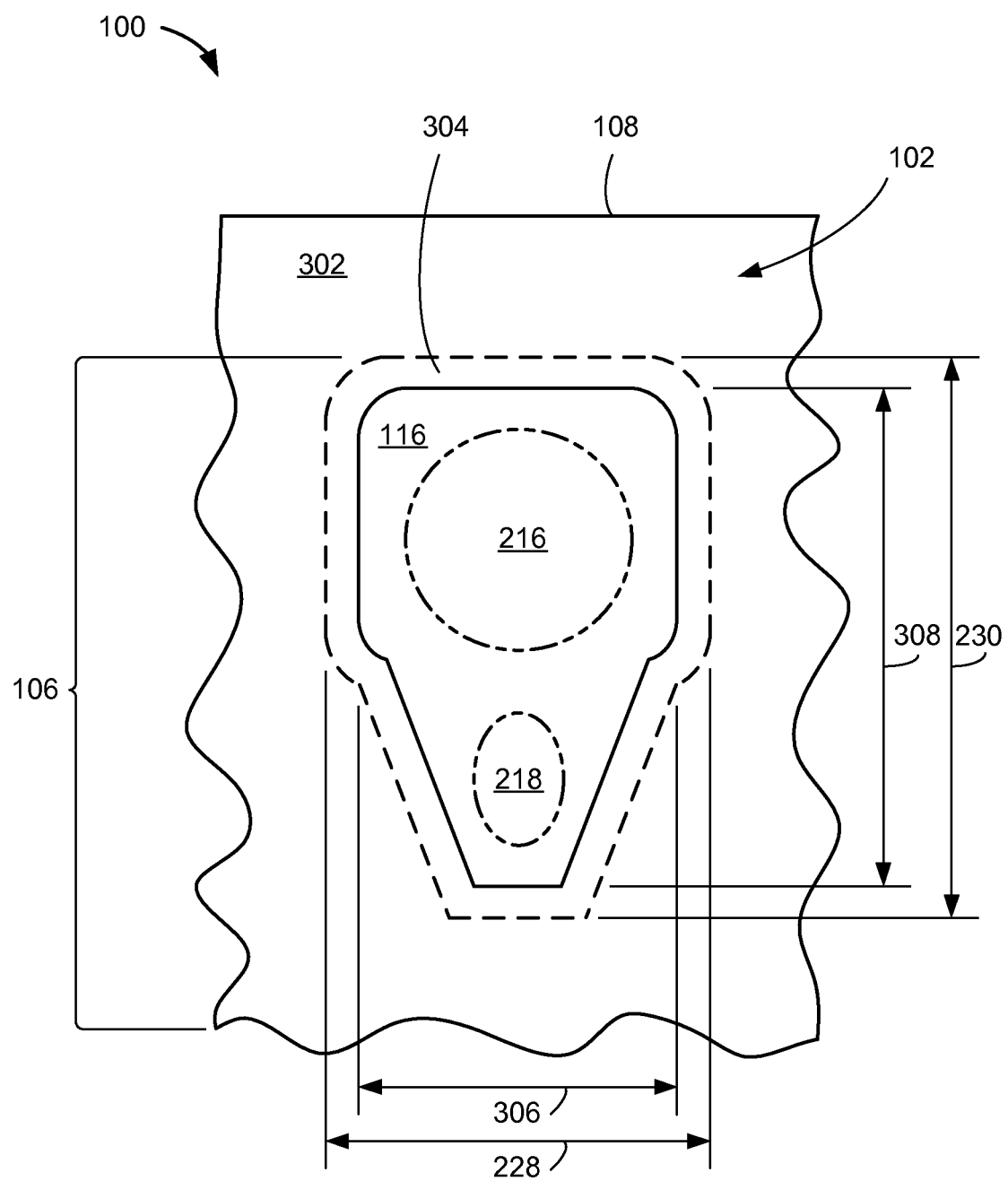
FIG. 3 is a more detailed view of a portion of the outer bond pad covered by a passivation layer.

Referring now to FIG. 3, therein is shown a more detailed view of a portion of the outer bond pad 116 covered by a passivation layer 302. The passivation layer 302 can prevent contamination from occurring in the semiconductor component 102. The passivation layer 302 can also prevent delamination or separation of chip layers from spreading toward an active chip area. The more detailed view depicts a portion of the integrated circuit packaging system 100 shown with only the outer bond pad 116.

For example, the passivation layer 302 can include a Silicon Nitride (SiN) passivation or a photosensitive polyimide (PSPI) passivation. Also for example, the passivation layer 302 can include a surface passivation layer, a passivation layer including polyimide, or a layer including dielectric or silicon dioxide (SiO2). The passivation layer 302 can be deposited or formed on or over an upper conductive layer of the semiconductor component 102.

The integrated circuit packaging system 100 can include the outer bond pad 116 formed in the pad region 106 and adjacent the component periphery 108. The outer bond pad 116 can include the outer core pad 216 and the outer probe pad 218.

The integrated circuit packaging system 100 can include sealing the portion of the outer bond pad 116 with the passivation layer 302 thereon. The passivation layer 302 can be formed to overlap with the portion of the outer bond pad 116 or the inner bond pad 112 of FIG. 2 in an overlap region 304. The overlap region 304 can include an area covered by the passivation layer 302 on or over a portion of the inner bond pad 112 and the portion of the outer bond pad 116.

The integrated circuit packaging system 100 can include an exposed area, which can include an open area that is not covered by or formed with the passivation layer 302. The outer core pad 216 and the outer probe pad 218 are exposed from the passivation layer 302 in the exposed area.

The exposed area can be smaller than a planar area of the outer bond pad 116. The exposed area has a pad opening width 306 and a pad opening length 308. The pad opening width 306 and the pad opening length 308 can include segments of the bond pad width 228 and the bond pad length 230 that are exposed from or not covered with the passivation layer 302, respectively.

Dimensions of the pad opening width 306 and the pad opening length 308 can depend on process technologies. The pad opening width 306 and the pad opening length 308 can be smaller than the bond pad width 228 and the bond pad length 230, respectively. For example, the pad opening width 306 and the pad opening length 308 can be 4 microns (um) smaller than the bond pad width 228 and the bond pad length 230, respectively. In other words, at each opposite side, the pad opening width 306 is 2 um smaller than the bond pad width 228, the pad opening length 308 is 2 um smaller than the bond pad length 230, and the overlap region 304 is 2 um. This value can vary depending on the process technologies and design rules.

For illustrative purposes, the more detailed view is shown with the outer bond pad 116, although it is understood that the integrated circuit packaging system 100 includes another exposed area exposing a portion of the inner bond pad 112. The integrated circuit packaging system 100 can include the inner core pad 202 of FIG. 2 and the inner probe pad 204 of FIG. 2 exposed from the passivation layer 302 in the another exposed area.

Figure 4:
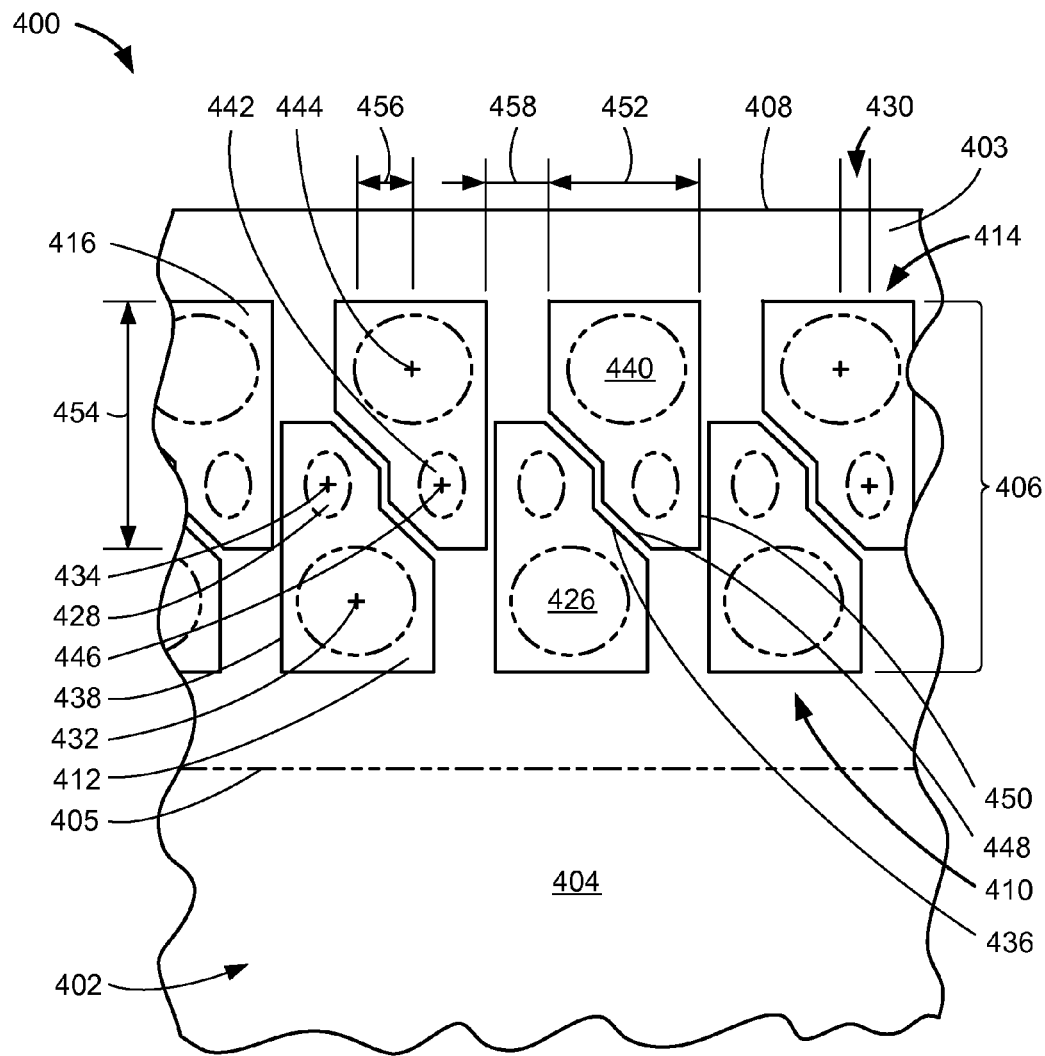
FIG. 4 is a more detailed view of a portion of an integrated circuit packaging system in a second embodiment of the present invention.

Referring now to FIG. 4, therein is shown a more detailed view of a portion of an integrated circuit packaging system 400 in a second embodiment of the present invention. The more detailed view is depicted without the passivation layer 302 of FIG. 3.

The integrated circuit packaging system 400 can include a semiconductor component 402, such as an integrated circuit, a die, a chip, a semiconductor device, or a semiconductor package. The semiconductor component 402 can include a semiconductor substrate 403, such as a silicon, a chip substrate, a die substrate, a metalized substrate, a glass substrate, or a semiconductor device mounting support.

The semiconductor component 402 can be formed to include a core region 404, which can include an interior portion of the semiconductor component 402 with digital or analog circuits. The core region 404 can include a core side 405, which can include one of the sides at the perimeter of the core region 404. The core region 404 can be formed over or on the semiconductor substrate 403. The semiconductor component 402 includes a pad region 406, which can include input/output (I/O) cells and I/O pads, formed surrounding the core region 404 and over or on the semiconductor substrate 403.

The I/O pads can surround the I/O cells at a component periphery 408, which can include a boundary or a perimeter of the semiconductor component 402. The pad region 406 can be provided between the core region 404 and the component periphery 408.

The pad region 406 can include an inner row 410 of I/O pads. The inner row 410 can be adjacent the core region 404. The inner row 410 can include an inner bond pad 412, such as an I/O pad, a contact pad, or a pad for attaching a wire or an interconnect thereto, formed over or on the semiconductor substrate 403. The inner bond pad 412 can be outside the core region 404.

The inner bond pad 412 can be electrically interconnected to an I/O cell, which in turn provides access to or from the core region 404. The inner bond pad 412 can be formed with Aluminum (Al) or any other conductive material.

The inner bond pad 412 can include an inner core pad 426, which can include a wire ball bond area. The inner core pad 426 provides a permanent connection to the core region 404 in the final product of the integrated circuit packaging system 400.

The inner bond pad 412 can also include an inner probe pad 428, which can include a probe mark area, a probe point, or a portion of a pad where a lead or a probe of a probe card contacts. The inner probe pad 428 is intended for probe test and not for providing permanent connection to the core region 404 in the final product of the integrated circuit packaging system 400. The inner probe pad 428 can be further from the core region 404 than the inner core pad 426.

The inner bond pad 412 can be formed with the inner core pad 426 at an offset 430 from the inner probe pad 428. An inner core pad center 432 of the inner core pad 426 can be at the offset 430 from an inner probe pad center 434 of the inner probe pad 428.

The inner bond pad 412 can include the inner core pad center 432 and the inner probe pad center 434 not aligned perpendicular to the core side 405. The inner core pad center 432 or the inner probe pad center 434 can include a point that is substantially equidistant from points on an edge of the inner core pad 426 or the inner probe pad 428, respectively.

The inner bond pad 412 can include an inner abutment portion 436. The inner bond pad 412 can include an inner straight edge 438, which can include a portion at the boundary of the inner bond pad 412. The inner abutment portion 436 includes a portion of the inner straight edge 438 that is adjacent to the inner probe pad 428. The inner abutment portion 436 includes multiple edge segments with one segment being parallel to the inner straight edge 438, one segment perpendicular to the inner straight edge 438, and other edge segments being obtuse to the inner straight edge 438. The inner probe pad 428 is within the inner abutment portion 436.

The pad region 406 can include an outer row 414 of I/O pads. The outer row 414 can be adjacent the component periphery 408. The outer row 414 can include an outer bond pad 416, such as an I/O pad, a contact pad, or a pad for attaching a wire or an interconnect thereto, formed over or on the semiconductor substrate 403. The inner bond pad 412 can include the inner abutment portion 436 facing the outer bond pad 416. The outer bond pad 416 can be outside the core region 404.

The outer bond pad 416 can be electrically interconnected to an I/O cell, which in turn provides access to or from the core region 404. The outer bond pad 416 can be formed with Aluminum (Al) or any other conductive material.

The outer bond pad 416 can include an outer core pad 440, which can include a wire ball bond area. The outer core pad 440 provides a permanent connection to the core region 404 in the final product of the integrated circuit packaging system 400.

The outer bond pad 416 can also include an outer probe pad 442, which can include a probe mark area, a probe point, or a portion of a pad where a lead or a probe of a probe card contacts. The outer probe pad 442 is intended for probe test and not for providing permanent connection to the core region 404 in the final product of the integrated circuit packaging system 400. The outer probe pad 442 can be closer to the core region 104 than the outer core pad 440.

The outer probe pad 442 and the inner probe pad 428 are substantially aligned parallel to the core side 405. The outer bond pad 416 can be formed with the outer core pad 440 at the offset 430 from the outer probe pad 442. An outer core pad center 444 of the outer core pad 440 can be at the offset 430 from an outer probe pad center 446 of the outer probe pad 442.

The outer bond pad 416 can include the outer core pad center 444 and the outer probe pad center 446 not aligned perpendicular to the core side 405. The outer core pad center 444 or the outer probe pad center 446 can include a point that is substantially equidistant from points on an edge of the outer core pad 440 or the outer probe pad 442, respectively.

The outer bond pad 416 can include an outer abutment portion 448 facing the inner bond pad 412. The outer bond pad 416 can include an outer straight edge 450, which can include a portion at the boundary of the outer bond pad 416. The outer abutment portion 448 includes a portion of the outer straight edge 450 that is adjacent to the outer probe pad 442. The outer abutment portion 448 includes multiple edge segments with one segment being parallel to the outer straight edge 450, one segment perpendicular to the outer straight edge 450, and other edge segments being obtuse to the outer straight edge 450.

The outer abutment portion 448 is the substantially the same geometric shape as and symmetrical to the inner abutment portion 436. The inner row 410 of the inner bond pad 412 has the inner abutment portion 436 facing the outer abutment portion 448 in the outer row 414 of the outer bond pad 416. The outer probe pad 442 is within the outer abutment portion 448.

The inner bond pad 412 or the outer bond pad 416 can include a bond pad width 452, which can be at right angles to a bond pad length 454 of the inner bond pad 412 or the outer bond pad 416, respectively. The bond pad width 452 can vary depending on process technologies. For example, the bond pad width 452 can be greater than that of a conventional fine pitch wirebond pad structure.

For illustrative purposes, the inner bond pad 412 and the outer bond pad 416 are shown having the same dimension of the bond pad width 452, although it is understood that the inner bond pad 412 can have a pad width that is different than that of the outer bond pad 416. For example, the inner bond pad 412 can have a pad width that is smaller than that of the outer bond pad 416.

The bond pad length 454 of the inner bond pad 412 or the outer bond pad 416 can include a longest dimension of the inner bond pad 412 or the outer bond pad 416, respectively. The bond pad length 454 can vary depending on process technologies. For example, the bond pad length 454 can be substantially equal to that of a conventional fine pitch wirebond pad structure.

For illustrative purposes, the inner bond pad 412 and the outer bond pad 416 are shown having the same dimension of the bond pad length 454, although it is understood that the inner bond pad 412 can have a pad length that is different than that of the outer bond pad 416. For example, the inner bond pad 412 can have a pad length that is greater than that of the outer bond pad 416.

The integrated circuit packaging system 400 can include a pad pitch 456, which is defined as a smaller pitch size measured from the inner core pad center 432 to the outer core pad center 444 that is adjacent to the inner core pad center 432. The outer bond pad 416 can be formed with the pad pitch 456 that can be approximately half of the bond pad width 452 of the outer bond pad 416.

For illustrative purposes, the pad pitch 456 between the inner bond pad 412 and the outer bond pad 416 is the same, although it is understood that the pad pitch 456 can be different between the inner row 410 and the outer row 414. For example, the pad pitch 456 from the inner bond pad 412 to the outer bond pad 416 adjacent the inner bond pad 412 is different than that from the outer bond pad 416 to another of the inner bond pad 412 adjacent the outer bond pad 416.

The inner bond pad 412 can be substantially the same as the outer bond pad 416. The outer bond pad 416 can be placed or formed adjacent the inner bond pad 412. The outer bond pad 416 can be placed between the inner bond pad 412 and another of the inner bond pad 412.

The outer bond pad 416 and the inner bond pad 412 can be formed in a staggered configuration. The outer bond pad 416 and the inner bond pad 412 can be placed at alternating positions and offset relative to each other.

The outer bond pad 416 and the inner bond pad 412 can be formed with the inner probe pad 428 and the outer probe pad 442 therebetween. The inner bond pad 412 and the outer bond pad 416 can be isolated or separated by probe areas, which can include the inner probe pad 428 and the outer probe pad 442.

A portion of the outer bond pad 416 can be adjacent with a portion of the inner bond pad 412. The outer abutment portion 448 of the outer bond pad 416 can be adjacent with the inner abutment portion 436 of the inner bond pad 412.

The integrated circuit packaging system 400 can provide a probing area, which can include the inner probe pad 428 and the outer probe pad 442, positioned in between alternate staggered bond pads, which can include the inner bond pad 412 and the outer bond pad 416, with an in-line probing orientation. The in-line probing orientation can include the inner probe pad center 434 substantially in-line or collinear with the outer probe pad center 446.

The integrated circuit packaging system 400 can include a bond pad spacing 458, which can represent a gap or a measurement taken in an area that is between the inner bond pad 412 and another of the inner bond pad 412 or the outer bond pad 416 and another of the outer bond pad 416. The another of the inner bond pad 412 and the another of the outer bond pad 416 can be formed adjacent the inner bond pad 412 and the outer bond pad 416, respectively. The bond pad spacing 458 can vary depending on process technologies and design rules. For example, the bond pad spacing 458 can be greater than 2 microns (um) in order to prevent any ball bonding induced passivation sidewall damages or deformation.

The inner bond pad 412 or the outer bond pad 416 can be attached or connected to the terminal 120 of FIG. 1 by the first interconnect 122 of FIG. 1 or the second interconnect 124 of FIG. 1, respectively. The terminal 120 can be provided for further connections to the next system level.

Figure 5:
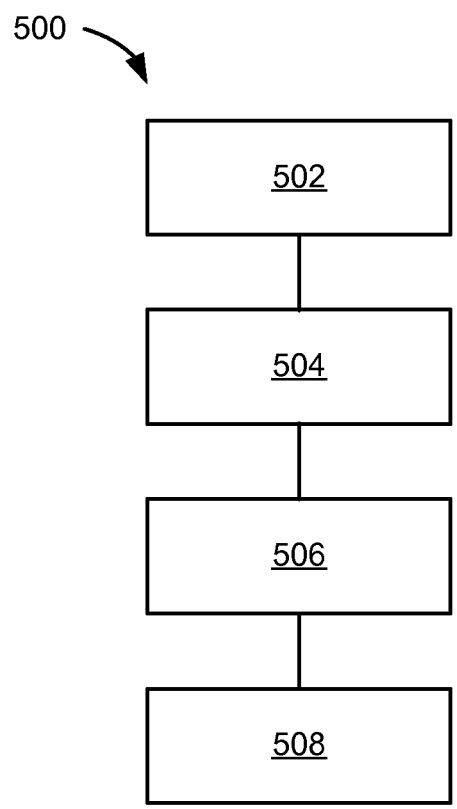
FIG. 5 is a flow chart of a method of manufacture of an integrated circuit packaging system in a further embodiment of the present invention.

Referring now to FIG. 5, therein is shown a flow chart of a method 500 of manufacture of an integrated circuit packaging system in a further embodiment of the present invention. The method 500 includes: providing a semiconductor substrate in a block 502; forming a core region on the semiconductor substrate with the core region having a core side in a block 504; forming an inner bond pad on the semiconductor substrate with the inner bond pad having an inner core pad and an inner probe pad with the inner probe pad further from the core region than the inner core pad in a block 506; and forming an outer bond pad on the semiconductor substrate and adjacent the inner bond pad with the outer bond pad having an outer core pad and an outer probe pad with the outer probe pad closer to the core region than the outer core pad, and the inner probe pad and the outer probe pad aligned parallel to the core side in a block 508.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
providing a semiconductor substrate;
forming a core region on the semiconductor substrate with the core region having a core side;
forming an inner bond pad on the semiconductor substrate with the inner bond pad having an inner core pad and an inner probe pad with the inner probe pad further from the core region than the inner core pad; and
forming an outer bond pad on the semiconductor substrate and adjacent the inner bond pad with the outer bond pad having an outer core pad and an outer probe pad with the outer probe pad closer to the core region than the outer core pad, the inner core pad between the outer probe pad and the core side, and the inner probe pad and the outer probe pad aligned in a row parallel to the core side.

2. The method as claimed in claim 1 wherein forming the outer bond pad includes forming the outer bond pad having a bond pad width and a pad pitch between the inner bond pad and the outer bond pad is approximately half of the bond pad width.

3. The method as claimed in claim 1 wherein:
forming the inner bond pad includes forming an inner abutment portion with the inner probe pad therein; and
forming the outer bond pad includes forming an outer abutment portion with the outer probe pad therein and the outer abutment portion facing the inner abutment portion.

4. The method as claimed in claim 1 wherein:
forming the inner bond pad includes:
  forming the inner core pad having an inner core pad center, and
  forming the inner probe pad having an inner probe pad center with the inner core pad center and the inner probe pad center aligned perpendicular to the core side; and
forming the outer bond pad includes:
  forming the outer core pad having an outer core pad center, and
  forming the outer probe pad having an outer probe pad center with the outer core pad center and the outer probe pad center aligned perpendicular to the core side.

5. The method as claimed in claim 1 wherein:
forming the inner bond pad includes:
  forming the inner core pad having an inner core pad center, and
  forming the inner probe pad having an inner probe pad center with the inner core pad center and the inner probe pad center not aligned perpendicular to the core side; and
forming the outer bond pad includes:
  forming the outer core pad having an outer core pad center, and
  forming the outer probe pad having an outer probe pad center with the outer core pad center and the outer probe pad center not aligned perpendicular to the core side.

6. A method of manufacture of an integrated circuit packaging system comprising:
providing a semiconductor substrate;
forming a core region on the semiconductor substrate with the core region having a core side;
forming an inner bond pad outside the core region and on the semiconductor substrate with the inner bond pad having an inner core pad, an inner probe pad further from the core region than the inner core pad, and an inner abutment portion; and
forming an outer bond pad outside the core region and on the semiconductor substrate with the outer bond pad having an outer core pad, an outer probe pad closer to the core region than the outer core pad, the inner core pad between the outer probe pad and the core side, and an outer abutment portion adjacent the inner abutment portion with the inner probe pad and the outer probe pad aligned in a row parallel to the core side.

7. The method as claimed in claim 6 wherein forming the outer bond pad includes forming the outer probe pad within the outer abutment portion.

8. The method as claimed in claim 6 wherein forming the inner bond pad includes forming the inner probe pad within the inner abutment portion.

9. The method as claimed in claim 6 wherein forming the outer bond pad includes forming the outer abutment portion facing the inner abutment portion.

10. The method as claimed in claim 6 wherein forming the outer bond pad includes forming the outer abutment portion symmetrical to the inner abutment portion.

11. An integrated circuit packaging system comprising:
a semiconductor substrate;
a core region on the semiconductor substrate with the core region having a core side;
an inner bond pad on the semiconductor substrate with the inner bond pad having an inner core pad and an inner probe pad with the inner probe pad further from the core region than the inner core pad; and
an outer bond pad on the semiconductor substrate and adjacent the inner bond pad with the outer bond pad having an outer core pad and an outer probe pad with the outer probe pad closer to the core region than the outer core pad, the inner core pad between the outer probe pad and the core side, and the inner probe pad and the outer probe pad aligned in a row parallel to the core side.

12. The system as claimed in claim 11 wherein the outer bond pad includes the outer bond pad having a bond pad width and a pad pitch between the inner bond pad and the outer bond pad is approximately half of the bond pad width.

13. The system as claimed in claim 11 wherein:
the inner bond pad includes an inner abutment portion with the inner probe pad therein; and
the outer bond pad includes an outer abutment portion with the outer probe pad therein and the outer abutment portion facing the inner abutment portion.

14. The system as claimed in claim 11 wherein:
the inner bond pad includes:
  the inner core pad having an inner core pad center, and
  the inner probe pad having an inner probe pad center with the inner core pad center and the inner probe pad center aligned perpendicular to the core side; and
the outer bond pad includes:
  the outer core pad having an outer core pad center, and
  the outer probe pad having an outer probe pad center with the outer core pad center and the outer probe pad center aligned perpendicular to the core side.

15. The system as claimed in claim 11 wherein:
the inner bond pad includes:
  the inner core pad having an inner core pad center, and
  the inner probe pad having an inner probe pad center with the inner core pad center and the inner probe pad center not aligned perpendicular to the core side; and the outer bond pad includes:
- the outer core pad having an outer core pad center, and
- the outer probe pad having an outer probe pad center with the outer core pad center and the outer probe pad center not aligned perpendicular to the core side.

16. The system as claimed in claim 11 wherein:

the inner bond pad includes the inner bond pad outside the core region, the inner bond pad having an inner abutment portion; and the outer bond pad includes the outer bond pad outside the core region, the outer bond pad having an outer abutment portion adjacent the inner abutment portion.

17. The system as claimed in claim 16 wherein the outer bond pad includes the outer probe pad within the outer abutment portion.

18. The system as claimed in claim 16 wherein the inner bond pad includes the inner probe pad within the inner abutment portion.

19. The system as claimed in claim 16 wherein the outer bond pad includes the outer abutment portion facing the inner abutment portion.

20. The system as claimed in claim 16 wherein the outer bond pad includes the outer abutment portion symmetrical to the inner abutment portion.

* * * * *